(12) United States Patent
Waldfried et al.

(10) Patent No.: US 6,951,823 B2
(45) Date of Patent: Oct. 4, 2005

(54) PLASMA ASHING PROCESS

(75) Inventors: Carlo Waldfried, Falls Church, VA (US); Orlando Escorcia, Falls Church, VA (US); Qingyuan Han, Columbia, MD (US); Thomas Buckley, Ijamsville, MD (US); Palani Sakthivel, Gaithersburg, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 85 days.

(21) Appl. No.: 10/638,570

(22) Filed: Aug. 11, 2003

(65) Prior Publication Data

US 2004/0084412 A1 May 6, 2004

Related U.S. Application Data

(63) Continuation-in-part of application No. 09/855,177, filed on May 14, 2001, now Pat. No. 6,630,406.

(51) Int. Cl.[7] .................. H01L 21/302; H01L 21/461
(52) U.S. Cl. .................. 438/710; 438/711; 438/714; 438/725
(58) Field of Search .................. 438/706, 710–712, 438/714, 715, 725

(56) References Cited

U.S. PATENT DOCUMENTS

| | | | |
|---|---|---|---|
| 5,210,042 A | * | 5/1993 | Oshikawa .................. 438/395 |
| 5,352,636 A | | 10/1994 | Beinglass |
| 5,545,289 A | | 8/1996 | Chen et al. |
| 5,660,682 A | | 8/1997 | Zhao et al. |
| 5,965,934 A | | 10/1999 | Cheung et al. |
| 6,037,255 A | | 3/2000 | Hussein et al. |
| 6,107,192 A | | 8/2000 | Subrahmanyan et al. |
| 6,114,259 A | | 9/2000 | Sukharev et al. |
| 6,187,684 B1 | * | 2/2001 | Farber et al. .................. 438/704 |
| 6,207,583 B1 | | 3/2001 | Dunne et al. |
| 6,281,135 B1 | * | 8/2001 | Han et al. .................. 438/725 |
| 6,313,042 B1 | | 11/2001 | Cohen et al. |
| 6,319,842 B1 | | 11/2001 | Khosla et al. |
| 6,346,489 B1 | | 2/2002 | Cohen et al. |
| 6,355,571 B1 | | 3/2002 | Huang et al. |
| 6,448,177 B1 | * | 9/2002 | Morrow et al. .................. 438/638 |
| 6,479,391 B2 | * | 11/2002 | Morrow et al. .................. 438/706 |
| 6,524,936 B2 | * | 2/2003 | Hallock et al. .................. 438/531 |
| 6,630,406 B2 | * | 10/2003 | Waldfried et al. .................. 438/710 |
| 6,667,244 B1 | * | 12/2003 | Cox et al. .................. 438/712 |

FOREIGN PATENT DOCUMENTS

EP          1 081 751 A2      3/2001

\* cited by examiner

Primary Examiner—Amir Zarabian
Assistant Examiner—Khanh Duong
(74) Attorney, Agent, or Firm—Cantor Colburn LLP

(57) ABSTRACT

A substantially oxygen-free and nitrogen-free plasma ashing process for removing photoresist in the presence of a low k material from a semiconductor substrate includes forming reactive species by exposing a plasma gas composition to an energy source to form plasma. The plasma gas composition is substantially free from oxygen-bearing and nitrogen-bearing gases. The plasma selectively removes the photoresist from the underlying substrate containing low k material by exposing the photoresist to substantially oxygen and nitrogen free reactive species. The process can be used with carbon containing low k dielectric materials.

40 Claims, 7 Drawing Sheets

PLASMA ASHING PROCESS

CROSS REFERENCE TO RELATED APPLICATIONS

The present disclosure is a continuation-in-part application of, and claims is priority to, U.S. patent application Ser. No. 09/855,177, filed on May 14, 2001, now U.S. Pat. No. 6,630,406, incorporated herein by reference in its entirety.

BACKGROUND

The present disclosure relates generally to plasma ashing processes for selectively removing photoresist, organic overlayers, and polymer residues from a substrate surface, and in particular, to a substantially oxygen-free and nitrogen-free plasma ashing process.

Ashing is a plasma mediated stripping process by which photoresist, organic overlayers, and/or polymer residues are stripped or removed from a substrate upon exposure to the plasma. Ashing generally occurs after an etching process has been performed in which the photoresist material is used as a photomask for etching a pattern into the substrate. The ashing process is also used to remove other organic layers such as the anti-reflection coating (ARC), if present. Additionally, the ashing process may be performed for removal of misaligned resist patterns ("rework wafers") and in lift-off processes. It is well known that the process steps occurring prior to ashing may modify the surface of the photoresist and ARC, and/or form polymers/residues. It is highly desirable when ashing that complete removal of the photoresist and other organic overlayers, polymers/residues occur as quickly as possible without loss of any of the materials comprising the underlayers.

It is important to note that ashing processes significantly differ from etching processes. Although both processes may be plasma mediated, an etching process is markedly different in that the plasma chemistry is chosen to permanently transfer an image into the substrate by removing portions of the substrate surface through openings in a photoresist mask. The plasma generally includes high energy ion bombardment at low temperatures to remove portions of the substrate. Moreover, the portions of the substrate exposed to the ions are generally removed at a rate equal to or greater than the removal rate of the photoresist mask. In contrast, ashing processes generally refer to selectively removing the photoresist mask and any polymers or residues formed during etching. The ashing plasma chemistry is much less aggressive than etching chemistries and generally is chosen to remove the photoresist mask layer at a rate much greater than the removal rate of the underlying substrate. Moreover, most ashing processes heat the substrate to temperatures greater than 200° C. to increase the plasma reactivity. Thus, etching and ashing processes are directed to removal of significantly different materials and as such, require completely different plasma chemistries and processes. Successful ashing processes are not used to permanently transfer an image into the substrate. Rather, successful ashing processes are defined by the photoresist, polymer and residue removal rates without affecting or removing layers comprising the underlying substrate.

Ashing selectivity is defined as the relative removal rate of the photoresist and other organic overlayers, compared to the underlying layer. It is generally preferred to have an ashing selectivity of at least 50:1, wherein the photoresist is removed at least 50 times faster than the underlying substrate. More preferably, the ashing selectivity is much greater than 100:1.

During plasma ashing processes, it is important to maintain a critical dimension (CD) for the various features within a tightly controlled specification as well as promote proper underlayer surface conditions for successful metal filling in the process steps occurring after photoresist and/or polymer/residue removal. Small deviations in the patterned profiles formed in the underlayers can adversely impact device performance, yield and reliability of the final integrated circuit. Traditionally, the ashing plasma has been generated from oxygen-containing gases. However, it has been found that oxygen-containing plasmas readily damage certain materials used in advanced integrated circuit manufacture. For example, oxygen-containing plasmas are known to raise the dielectric constant of low k dielectric underlayers during plasma processing. The increases in dielectric constant affects, among others, interconnect capacitance, which directly impacts device performance. Moreover, the use of oxygen-containing plasmas is generally less preferred for advanced device fabrication employing copper metal layers.

In order to overcome these problems, oxygen-free plasma chemistries have been developed. Oxygen-free plasmas can be used to effectively remove photoresist, organic overlayers, and polymers/residues from substrates containing low k dielectric materials without physically damaging the low k dielectric layer. Oxygen-free plasmas are typically generated from a hydrogen and nitrogen gas mixture that may further contain fluorine gases. However, in some cases, it has been found that the use of oxygen-free plasmas containing nitrogen may alter and/or affect the chemical, mechanical and electrical properties of the underlying substrate. For example, exposing carbon and/or hydrogen containing low k dielectric materials to oxygen-free plasma generated from hydrogen, nitrogen and fluorine gas mixtures results in significant damage. Occasionally, the damage is not detected during metrology inspection of the substrate after plasma processing. However, the damage can be readily demonstrated by a subsequent wet cleaning process, as may be typically employed after plasma ashing, wherein portions of the carbon and/or hydrogen-containing low k dielectric material are removed. The removed portions of the dielectric material are a source of variation in the critical dimension (CD) of the feature that is frequently unacceptable and impacts overall device yield. Moreover, even if a wet clean process is not included, the electrical and mechanical properties of the dielectric material may be changed by exposure to the oxygen-free plasmas thereby affecting operating performance. It is believed that carbon is depleted from the dielectric material during the plasma exposure. Since oxygen-free plasmas are normally generated from gas mixtures that contain nitrogen, it is believed that nitrogen damages the dielectric in such a way that it causes problems during subsequent metal filling processes, such as the creation of voids at the bottom of trench structures.

Accordingly, it is highly desirable to have an ashing plasma chemistry that completely and rapidly removes the photoresist, any organic overlayers, polymers/residues without affecting or removing the underlying surface materials.

BRIEF SUMMARY

Disclosed herein is a plasma ashing process for selectively removing photoresist and other organic overlayers from a semiconductor substrate including a low k material. The process comprises forming reactive species by exposing a plasma gas composition to an energy source to form a plasma, wherein the plasma is substantially free from reactive nitrogen species and reactive oxygen species; and exposing the substrate having the photoresist and/or the organic overlayers thereon to the reactive species to selectively remove the photoresist and/or the organic overlayers and leave the low k material substantially the same as before exposing the substrate to the reactive species.

In another embodiment, the plasma ashing process comprises forming reactive species by exposing a plasma gas composition to an energy source to form a plasma, wherein the plasma is substantially free from reactive nitrogen species and reactive oxygen species; introducing oxygen into the plasma in an amount effective to increase the ashing rate relative to not introducing oxygen into plasma; and exposing the substrate having the photoresist and/or organic overlayers thereon to the reactive species to selectively remove the photoresist and/or organic overlayers, wherein loss of the low k dielectric material is less than 50 angstroms after further exposure to a dilute hydrofluoric acid wet treatment process comprising wetting the substrate with a 100:1 hydrofluoric acid to deionized water solution for a period of 30 seconds.

A post etch plasma ashing process for selectively removing photoresist, organic overlayers, and polymers/residues from a semiconductor substrate, wherein the substrate includes a layer comprising a carbon containing low k dielectric material having a dielectric constant less than 3.0, the plasma ashing process comprising placing the substrate including photoresist, and/or organic overlayers and/or polymers/residues on the surface of the substrate into a reaction chamber; forming reactive species by generating a plasma from a substantially nitrogen and oxygen free gas composition, wherein the substantially nitrogen and oxygen free gas composition comprises trace levels of oxygen and/or nitrogen containing gas; exposing the substrate to the reactive species formed in the plasma from the substantially nitrogen and oxygen free gas composition; and selectively removing the photoresist, organic overlayers, and polymers/residues from the surface by forming volatile compounds, rinse removable compounds and mixtures thereof, wherein the trace levels of oxygen and/or nitrogen are in an amount that removes less than about 50 angstroms of the low k dielectric material after further exposure to a wet treatment process comprising wetting the substrate with a solution comprising a 100:1 hydrofluoric acid to deionized water solution for a period of 30 seconds.

A method of manufacturing a microelectronic device comprises forming a photoresist mask on a surface of a semiconductor substrate, wherein the substrate includes a carbon containing low k dielectric layer; etching and removing portions of the substrate through openings in the photoresist mask to permanently transfer an image into the substrate and expose a surface of the low k dielectric layer, wherein the etching forms polymers and residues on the substrate; and selectively ashing the photoresist mask, and removing or rendering removable the polymers and residues from the substrate with a substantially oxygen and nitrogen free plasma generated from a gas mixture comprising hydrogen and helium.

A plasma ashing process for selectively stripping photoresist and/or organic overlayers and/or polymers/residues from a surface of a substrate comprises placing a substrate having a photoresist/organic mask thereon into a reaction chamber; generating a substantially oxygen and nitrogen free plasma from a gas mixture comprising hydrogen and helium, wherein the gas mixture comprises levels of oxygen and/or nitrogen containing gas in an amount that removes less than about 50 angstroms of the low k dielectric material after ashing the photoresist mask and a subsequent wet treatment process, and wherein the plasma contains both electrically neutral and charged particles; substantially removing the charged particles from the plasma; exposing the substrate and the photoresist/organic mask to the electrically neutral species in the plasma, wherein the substrate exposed to the plasma includes a carbon containing low k dielectric material; and ashing the photoresist/organic mask to selectively remove the mask from the substrate, wherein the chemical composition of the low k dielectric layer is substantially the same as before the step of exposing the substrate to the plasma.

In another embodiment, the plasma ashing process for selectively stripping photoresist, organic overlayer, and/or polymers/residues from a surface of a substrate including a low k material comprises placing the substrate having the photoresist mask, organic overlayer, and/or polymers and residues thereon into a reaction chamber; exposing the substrate at a first temperature to a plasma substantially free from oxygen and nitrogen species; adding trace amounts of oxygen and/or nitrogen to the plasma for a first period of time; and increasing the first temperature to a second temperature and stopping the addition of the trace amounts of oxygen and/or nitrogen to the plasma, and exposing the substrate for a second period of time, wherein a total amount of oxygen and/or nitrogen in the plasma and a total amount of the time is effective to remove less than about 50 angstroms of the low k dielectric material after further exposure to a wet treatment process comprising wetting the substrate with a solution comprising a 100:1 hydrofluoric acid to deionized water solution for a period of 30 seconds.

In yet another embodiment, the plasma ashing process for selectively stripping photoresist, organic overlayer, and/or polymers/residues from a surface of a substrate including a low k material comprises placing the substrate having the photoresist mask, organic overlayer, and/or polymers/residues thereon into a reaction chamber; exposing the substrate at a first temperature to a plasma substantially free from oxygen and nitrogen species; adding trace amounts of oxygen and/or nitrogen to the plasma for a period of time; and decreasing the first temperature to a second temperature and adding trace amounts of oxygen and/or nitrogen to the plasma for a period of time, and exposing the substrate for a second period of time, wherein a total amount of oxygen and/or nitrogen in the plasma and a total amount of the time is effective to remove less than about 50 angstroms of the low k dielectric material after further exposure to a wet treatment process comprising wetting the substrate with a solution comprising a 100:1 hydrofluoric acid to deionized water solution for a period of 30 seconds.

These and other objects, advantages and features of the disclosure will become better understood from the detailed description of the disclosure that is described in conjunction with the accompanying drawings.

DETAILED DESCRIPTION

Figure 1A:
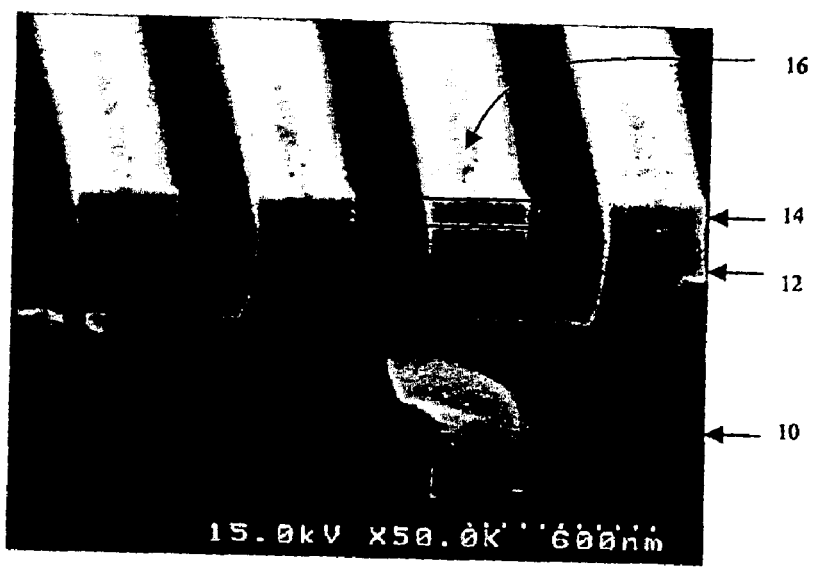
FIG. 1A is a scanning electron microscopy micrograph of trench features after a conventional post etch ashing process using a helium/hydrogen gas mixture (He/H$_2$) as one of the plasma gas components for generating the plasma.

A process for selectively removing photoresist, organic overlayers, and polymers/residues from a substrate. Generally, the process includes ashing the substrate with plasma that is both oxygen-free and nitrogen-free for selectively removing the photoresist, organic overlayers, and polymers/residues from the substrate. The ashing process is especially suitable for use in removing photoresist, organic overlayers, and polymers/residues from substrates that include low k dielectric materials therein. Preferably, the process is used with substrates, wherein the low k materials contain carbon and/or hydrogen within its structure such as doped oxides, porous materials and organic low k films. The carbon-containing low k dielectric materials may include pendant groups that contain carbon or may be carbon based, wherein the backbone of the dielectric material is primarily comprised of an interconnecting network of silicon. The process employing the nitrogen-free and oxygen-free plasma provides high ashing selectivity and overcomes the problems noted in the prior art that occur from ashing photoresist, polymers/residues from carbon and/or hydrogen based low k dielectric materials. Moreover, the process alleviates the subsequent metal filling problems caused by nitrogen in the ashing plasma.

In accordance with another embodiment, it has unexpectedly been found that trace amounts of oxygen and/or nitrogen can be tolerated in the ashing process. Accordingly, it has now been discovered that a substantially free and substantially nitrogen free plasma ashing process can be employed that does not damage the low k dielectric surface. The use of trace amounts, as will be described herein, provides a more economical solution for the plasma ashing process. For example, a lower leak rate specification can be tolerated for the plasma chamber as well as the use of substantially oxygen and nitrogen-free gases that have a lower purity specification, thereby lowering costs. In addition, it has been found to be advantageous in having small amounts of oxygen in the plasma since it has been found that the ash rate of photoresist and/or other organic overlayers is enhanced, more stable, and selectivity is improved.

The ashing process includes generating reactive species from a plasma gas mixture and exposing a substrate to the reactive species. The particular components of the plasma gas mixture are selected by their ability to form a gas and plasma at plasma forming conditions. The gas mixture selected is free or substantially free from components that generate reactive oxygen species and reactive nitrogen species at plasma forming conditions. More preferably, the gas mixture is free or substantially free from oxygen-containing compounds and nitrogen-containing compounds. The gas mixture may include reactive gases such as a fluorine-bearing gas, a hydrogen-bearing gas, and mixtures thereof. However, for certain low k materials, the presence of fluorine can be detrimental to the physical and chemical properties of the low k material. The gas mixture may further comprise an inert gas such as argon, helium, neon and the like. The plasma generated from the gas mixture primarily reacts with carbon and other atoms in the photoresist, polymers/residues to form volatile compounds and/or rinse removable compounds. The process is optimized to have an ashing selectivity greater than 50:1.

Hydrogen-bearing gases suitable for use in the process include those compounds that contain hydrogen. The hydrogen-bearing gases include hydrocarbons, hydrofluorocarbons, hydrogen gas or mixtures thereof. Preferred hydrogen-bearing gases exist in a gaseous state at plasma forming conditions and release hydrogen to form reactive hydrogen such as atomic hydrogen species under plasma forming conditions. The hydrocarbons or hydrofluorcarbons are generally unsubstituted or may be partially substituted with a halogen such as bromine, chlorine or fluorine. Examples of hydrogen-bearing hydrocarbon gases include methane, ethane and propane.

Preferred hydrogen-bearing gases are mixtures of a hydrogen gas and a noble gas. Examples of noble gases suitable for use in the process include a gas in Group VIII of the periodic table such as argon, neon, helium and the like. Although prior art oxygen-free plasmas generally use a forming gas composition that includes a hydrogen and nitrogen gas mixture, the use of substantial amounts of nitrogen gas in the process is expressly excluded. Consequently, since forming gas is hereinafter defined as a gas containing a mixture of hydrogen and nitrogen gases (nitrogen is generally greater than about 70% by volume or more in the forming gas mixture), the use of forming gas in the process is expressly excluded. Particularly preferable for use in the present disclosure is a gas mixture that includes hydrogen and helium gases. Helium gas generates helium atoms in the plasma that are considered light atoms and readily diffuse to the substrate, which results in excellent carrier characteristics for plasma generated reactive hydrogen species.

For safety reasons, the percentage of hydrogen gas in the gas mixture generally does not exceed about 5 percent by volume of the gas mixture. However, higher amounts of hydrogen are acceptable and sometimes preferred for increasing the photoresist and organic overlayer removal rate and selectivity. Preferably, the amount of hydrogen in the gas mixture is from about 1 to about 99 percent of the total volume. More preferably, the amount of hydrogen in the gas mixture is from about 3 to about 30 percent of the total volume.

Fluorine-bearing compounds in the plasma are less than about 10 percent of the total volume of the plasma gas mixture to maximize selectivity. It has been found that when the fluorine compounds are greater than about 10 percent by volume, polymerization of the photoresist byproducts can occur making the polymerized photoresist more difficult to remove. Preferred fluorine compounds include those compounds that generate fluorine reactive species when excited by the plasma. Preferably, the fluorine compound is a gas at plasma forming conditions and is selected from the group consisting of a compound having the general formula $C_xH_yF_z$, wherein x ranges from 1 to 4, y ranges from 0 to 9 and z ranges from 1 to 10, HF, $F_2$ and $SF_6$. Other fluorine bearing compounds that do not generate reactive nitrogen or oxygen species will be apparent to those skilled in the art. More preferably, the fluorine-bearing compound is $CF_4$, $C_2F_6$ or mixtures thereof.

Photoresists are generally organic photosensitive films used for transfer of images to an underlying substrate. The present disclosure is generally applicable to ashing those photoresists used in g-line, i-line, DUV, 193 nm, and 157 nm applications or the like. This includes, but is not limited to, novolaks, polyvinylphenols, acrylates, acetals, polyimides, ketals, cyclic olefins or the like. Other photoresist formulations suitable for use in the present disclosure will be apparent to those skilled in the art in view of this disclosure. The photoresist may be positive acting or negative acting depending on the photoresist chemistries and developers chosen. Examples of organic overlayers include, but are not intended to be limited to, ARC, bottom antireflection coatings (BARC), and other proprietary sacrificial materials that are typically part of the mask ensemble.

The insulating layers used in advanced integrated circuits typically include the use of low k materials that have dielectric constants less than about 3.0. The low k dielectric materials can be spun onto the substrate as a solution or deposited by a chemical vapor deposition process. Important low k film properties include thickness and uniformity, dielectric constant, refractive index, adhesion, chemical resistance, thermal stability, pore size and distribution, coefficient of thermal expansion, glass transition temperature, film stress and copper diffusion coefficient. Low k dielectrics can be generally classified as dense and porous. Examples of porous low k dielectric materials include Nanoglass® (available from Honeywell Electronic Materials) and aerogels, porous MSQ, and other SiCOH-based porous materials. Examples of dense low k material include CORAL, AURORA, FlowFill and Black Diamond. Other suitable low k dielectric materials will be apparent to those skilled in the art in view of this disclosure.

The process can be practiced in conventional plasma ashers. The disclosure is not intended to be limited to any particular plasma asher. For example, a plasma asher employing an inductively coupled plasma reactor could be used or a downstream plasma asher could be used. Preferably, the plasma asher is a downstream plasma asher, such as for example, microwave plasma ashers commercially available under the trade name Fusion GEMINI ES® or Fusion ES3Lk® from Axcelis Technologies, Inc. in Rockville, Md. More preferably, the plasma asher is adapted to selectively expose the substrate to reactive atomic species.

Figure 4:
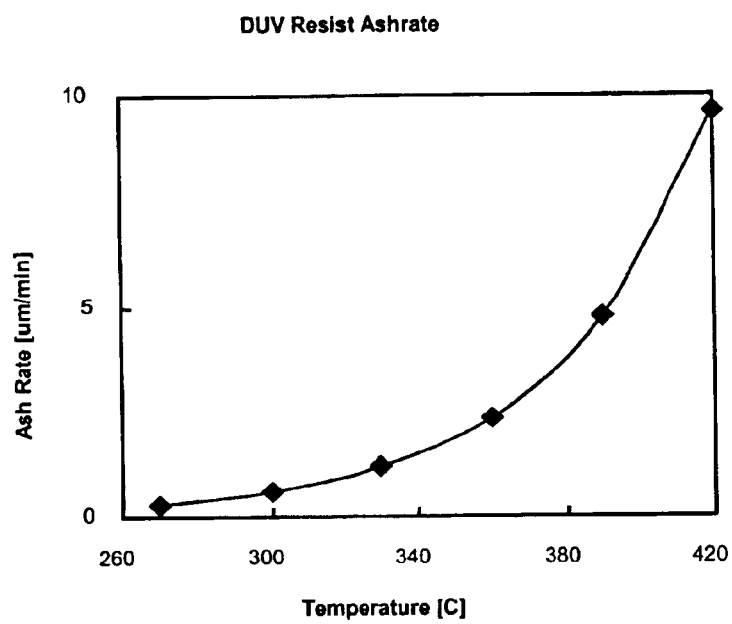
FIG. 4 graphically illustrates ashing rate as a function of temperature.

The settings and optimization for particular plasma ashers will be well within the skill of those in the art in view of this disclosure. Plasma ashers generally are comprised of a plasma generating chamber and a plasma reaction chamber. For exemplary purposes only, in a 300 mm Fusion ES3 downstream plasma asher, the wafers are preferably heated in the reaction chamber to a temperature between room temperature and 450° C. More preferably, the wafers are heated to temperatures ranging from about 250° C. to about 350° C. The temperatures used during processing may be constant or alternatively, ramped or stepped during processing. Increasing the temperature is recognized by those skilled in the art as a method to increase the ashing rate. FIG. 4 graphically illustrates ashing rate as a function of temperature. Clearly, ash rate is an exponential function of temperature and exhibits Arrhenius behavior.

The processing pressure within the reaction chamber is preferably about 1 torr or more. More preferably, the pressure is operated in a range from about 0.5 torr to about 4 torr. An excitable gas mixture is fed into the plasma-generating chamber via a gas inlet. The gas mixture is exposed to an energy source within the plasma-generating chamber, e.g., microwave energy, preferably between about 500 W and 5,000 W, to generate excited or energetic atoms from the gas mixture. The generated plasma is comprised of electrically neutral and charged particles formed from the gases used in the plasma gas mixture. The charged particles are selectively removed prior to plasma reaching the wafer. Preferably, the gas mixture for forming the plasma includes a hydrogen and helium gas mixture. More preferably, the gas mixture includes a mixture of hydrogen, helium, and fluorine gases. Optionally, insubstantial amounts of gas consisting of oxygen and/or nitrogen are added as a function of the purity of the gas, process chamber, or deliberately added. The oxygen and or nitrogen can be added as a noble gas, or alternatively, can be added as a gaseous compound containing oxygen and/or nitrogen. The total gas flow rate is preferably from about 500 to 12,000 standard cubic centimeters per minute (sccm) for the 300 mm downstream plasma asher. The photoresist, organic overlayers, and polymers/residues are selectively removed from the wafer by reaction with the excited or energetic atoms generated by the plasma. The reaction may be optically monitored for endpoint detection as is recognized by those in the art.

Where trace amounts of oxygen and/or nitrogen gases or compounds containing oxygen and nitrogen are added to the plasma gas composition, the plasma ashing process may comprise multiple steps depending on the desired application. One step may include stepwise ashing the substrate at temperature T1 using a plasma gas composition incorporating trace amounts of nitrogen and/or oxygen species, for a time $t_1$. A second subsequent step includes changing the substrate temperature to $T_2$, using a gas mixture substantially oxygen and nitrogen free, for a time $t_2$, wherein the total time is sufficient to substantial removal all of the photoresist, organic over layer and/or polymer/residue. The first temperature is preferably at about 100° C. to about 300° C. and the second temperature is preferably at about 250° C. to about 350° C. Alternatively, the reverse order of steps and/or temperatures may be employed.

While not wanting to be bound by theory, it is believed that prior art processes cause carbon depletion in the carbon-containing low k dielectric by generating reactive nitrogen or oxygen species in the plasma. The reactive oxygen and nitrogen species react with the carbon dopants of the dielectric to form volatile gases such as CO, $CO_2$, HCN and CN. Accordingly, the gas mixtures for forming the plasma do not contain any gases that generate substantial amounts of reactive nitrogen or oxygen species. The exact quantities of impurities are difficult to quantify due to the complexity of the various process parameters effecting damage to the low k dielectric material, e.g., ashing process time, ashing process temperature, wet chemical treatment time, wet chemical treatment material, and the like. As previously discussed, insubstantial amounts of reactive oxygen and nitrogen species can be included in the plasma and, if present, are preferably in an amount effective to provide a net loss of low k dielectric material of 50 angstroms as determined by the Low k Damage Test.

The Low k Damage Test comprises exposing a substrate including the low k dielectric material to plasma for a set amount of time, during which the presence of any oxygen or nitrogen in the plasma can deplete a portion of the carbon in the surface layer of the low k material. The wafer is subsequently subject to a wet treatment, which removes the carbon depleted portions of the low k dielectric material, thereby defining the amount of low k material loss or damage. A comparison of a pre-measurement of the thickness of the low k coating versus a post-measurement after plasma exposure and wet treatment allows quantification of the damage. The wet treatment process comprises immersing of the substrate into a dilute aqueous HF solution at room temperature. The dilute solution preferably has a concentration between 100:1 and 5,000:1 parts HF in deionize water (i.e., one part HF for every 100 pails deionized water). The immersion may last for period of time between 5 seconds and 180 seconds. This is followed by a deionized water rinse. In a preferred test, the substrate is immersed in a 100:1 dilute aqueous HF solution for 30 seconds.

After exposure to the oxygen and nitrogen free plasma or substantially oxygen and nitrogen-free plasma, the wafers may be exposed to a peroxide rinse, a deionized water rinse, or a wet stripper (such as the HF process described above) to remove any photoresist, polymer and residues remaining on the wafer. Wet strippers include acids, bases and solvents as is known to those skilled in the art. The particular wet strippers used are well within the skill of those in the art. For example, nitric acid, sulfuric acid, ammonia, hydrofluoric acid are commonly employed as wet strippers. In operation, the wet stripper is immersed, puddled, streamed, sprayed or the like onto the substrate and subsequently rinsed with deionized water. It has been found that the use of wet strippers is a fairly easy and inexpensive test to determine if the ashing plasma affects the chemical, electrical or mechanical properties of the underlying substrate.

The following examples are presented for illustrative purposes only, and are not intended to limit the scope of the disclosure.

EXAMPLE 1

As illustrated by this example, a significant advantage of the oxygen-free and nitrogen-free plasma process is the improvement in removal efficiency of photoresist, organic overlayers, and polymers/residues from substrates including carbon containing low k dielectrics without affecting the underlying dielectric layers. This is a significant commercial advantage as device manufacturers transition to the use of low k dielectric layers in the fabrication of advanced integrated circuits.

Figure 1B:
FIG. 1B is a scanning electron microscopy micrograph of trench features after a wet cleaning process of the substrate ashed in accordance with FIG. 1A.

Referring now to FIGS. 1A and 1B, trench patterns were etched into multiple silicon substrates 10 by an etcher using standard etching processes. The substrates 10 included a low k dielectric layer 12 and a silicon dioxide layer 14. The patterns were selectively etched by use of a patterned I-line photoresist mask. The low k dielectric layer 12 was a carbon-doped oxide commercially available under the trade name CORAL. The substrates were then ashed using a Fusion Gemini ES3 Plasma Asher available from Axcelis Technologies, Incorporated. Processing conditions are set forth in table I. The plasma gas mixture contained hydrogen, helium and $CF_4$ gases. The hydrogen gas was mixed with helium prior to generating the plasma, wherein the percentage of hydrogen gas was 5 percent by volume of the total hydrogen/helium mixture. The ashing process removed substantially all of the photoresist, polymers and post etch residues remaining on the substrate after etching. Some residue 16 remained on the substrates.

TABLE I

Oxygen-free and Nitrogen-free Plasma

| Step | Time (min.) | Pressure (torr) | Power (W) | Temp (° C.) | 5% $H_2$/He (sccm) | $CF_4$ (sccm) |
|---|---|---|---|---|---|---|
| 1 | 25 | 1.5 | Off | 370 | 5000 | 50 |
| 2 | 20 | 1.5 | 1500 | 370 | 5000 | 50 |

After ashing was complete, the substrates were subjected to a wet clean process. The substrates were dipped into a hydrofluoric (HF) acid bath for 2 minutes. The hydrofluoric acid bath was prepared from a 50% concentrate and diluted with deionized water at a 100:1 ratio. The substrates, after ashing and after wet stripping, were examined by cross-sectional analysis using scanning electron microscopy at a magnification of about 50,000×. FIG. 1A shows a representative cross-section of a substrate after the ashing process. FIG. 1B shows a representative cross-section of a substrate after the HF wet clean process. A comparison of the substrates after each process did not show any substantial changes to critical dimensions or feature profiles. The post etch residue 16 was effectively removed by the wet cleaning process.

EXAMPLE 2

In this example, the substrates were prepared in accordance with Example 1 and exposed to a conventional ashing plasma process. The plasma gas mixture included nitrogen gas in place of the helium gas and at the same volume percentage. All other conditions were identical to that in Example 1. The process conditions are shown in Table II.

TABLE II

Nitrogen-containing Plasma

| Step | Time (min.) | Pressure (torr) | Power (W) | Temp (° C.) | 5% $H_2$/$N_2$ (sccm) | $CF_4$ (sccm) |
|---|---|---|---|---|---|---|
| 1 | 25 | 1.5 | Off | 370 | 5000 | 50 |
| 2 | 20 | 1.5 | 1500 | 370 | 5000 | 50 |

Figure 2A:
FIG. 2A is a scanning electron microscopy micrograph of trench features after a conventional post etch ashing process using nitrogen-based forming gas (N$_2$/H$_2$) as one of the plasma gas components for generating the plasma.
Figure 2B:
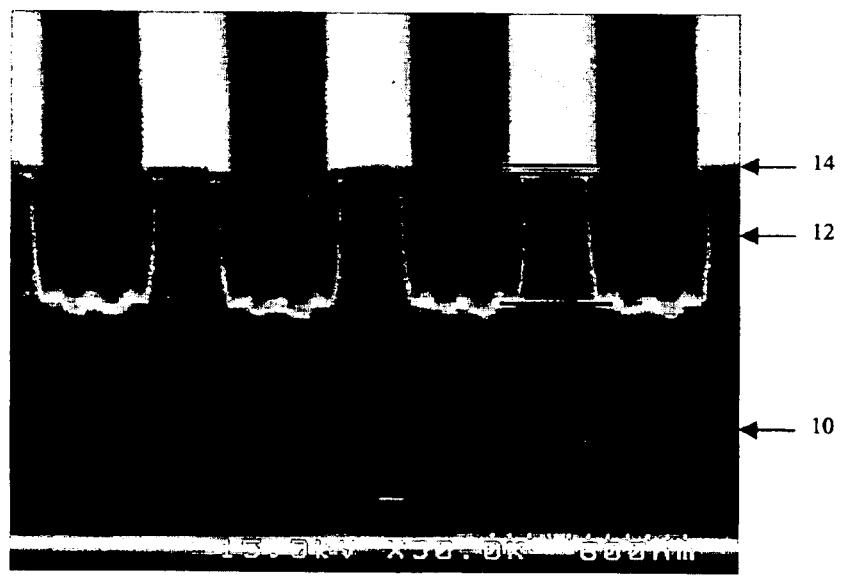
FIG. 2B is a scanning electron microscopy micrograph of trench features after a wet cleaning process of the substrate ashed in accordance with FIG. 2A.

As shown in FIG. 2A, scanning electron microscopy of substrates ashed with the nitrogen-containing plasma yielded results similar to the nitrogen-free plasma process of Example 1. A comparison of FIGS. 1A and 2A show similar etch profiles. However, as shown in FIG. 2B, exposing the ashed wafers to the same wet clean process used in Example 1 resulted in significant CD loss of the low k dielectric layer 12. The wet clean process clearly removed significant amounts of the low k dielectric material resulting in extensive undercutting. These results confirm that nitrogen present in the plasma at standard concentrations chemically modifies the low k dielectric layer 12 since the only variable changed between the processes used Examples 1 and 2 was the choice of the buffer gas: nitrogen or helium. Moreover, analysis of the substrates exposed to the nitrogen-containing plasma did not show any visible physical damage between the different plasmas until the substrates were exposed to the wet clean process. Moreover, since the nitrogen-containing ashing process chemically modified the low k dielectric underlayer, it is reasonable to assume that the mechanical and electrical properties have changed as well. In contrast, exposing the substrates to a plasma that is both substantially oxygen-free and nitrogen free did not demonstrate this behavior.

EXAMPLE 3

Figure 3:
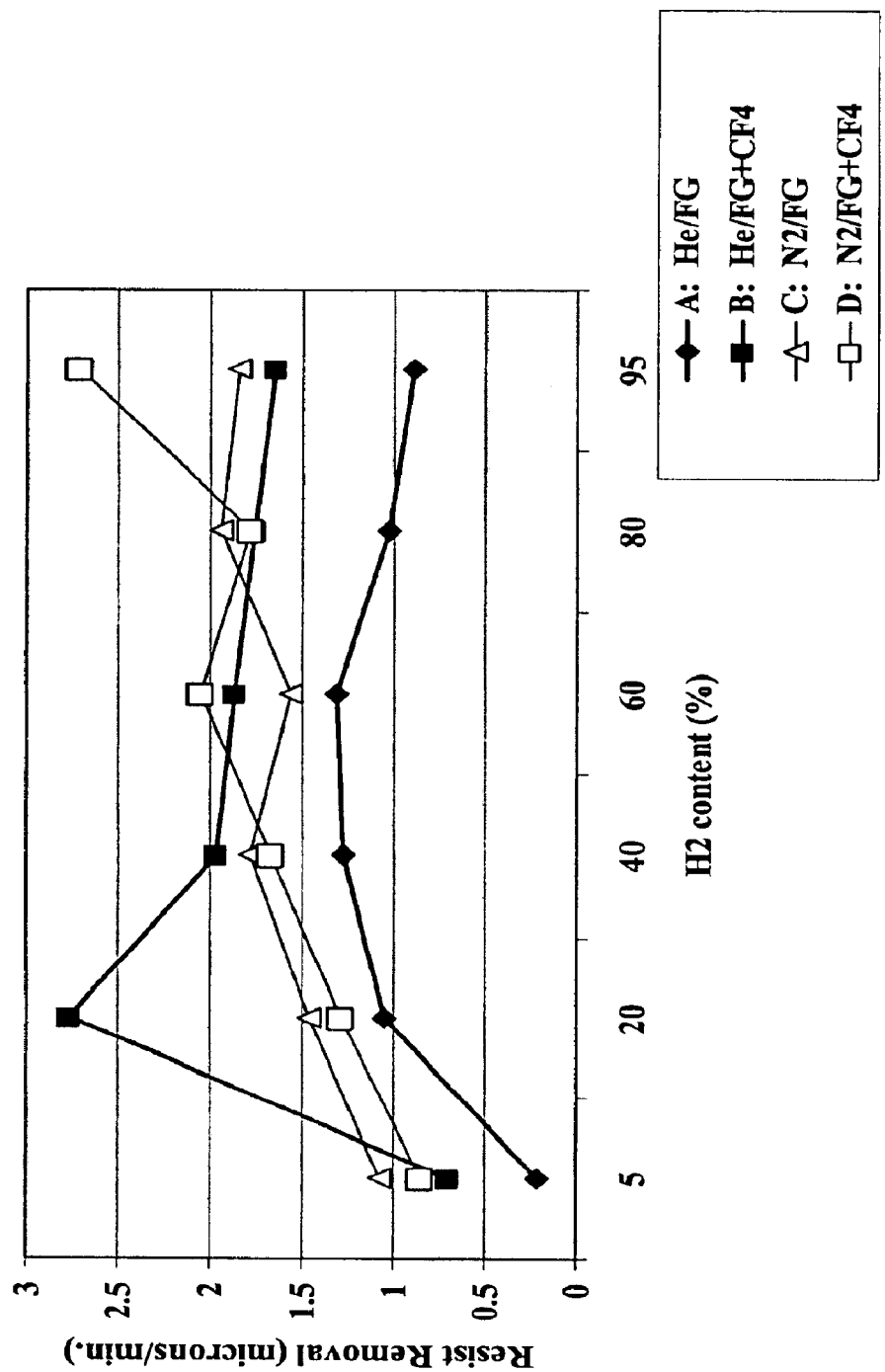
FIG. 3 is a graph depicting photoresist removal rates for various plasma gas mixtures including helium gas or nitrogen gas as a function of percent hydrogen gas in the mixture used to form the plasma.

In this example, the rate of photoresist removal was monitored as a function of the percentage of hydrogen gas in the plasma. Substrates were coated with a thick layer of photoresist and exposed to one of four different plasmas (A–D) in a Fusion Gemini ES3 plasma asher. The process conditions and flow rates were held constant for each wafer set. The photoresist thickness was conventionally measured by ellipsometry before and after processing in order to determine the removal rate. As shown in Table III, the substrates were exposed to: A. a nitrogen-free plasma, B. a nitrogen-free plasma with tetrafluoromethane ($CF_4$), C. a nitrogen-containing plasma and D. a nitrogen-containing plasma with $CF_4$. The percentage of hydrogen in the plasma gas mixture was varied as a percentage of the total volume of the hydrogen gas mixture. The results are graphically shown in FIG. 3.

TABLE III

Plasma Gas Compositions

| PLASMA | Hydrogen/Nitrogen (FORMING GAS) flow rate (sccm) | Hydrogen/Helium flow rate (sccm) | $CF_4$ flow rate (sccm) |
| --- | --- | --- | --- |
| A | OFF | 7000 | OFF |
| B | OFF | 6990 | 10 |
| C | 7000 | OFF | OFF |
| D | 6990 | OFF | 10 |

The nitrogen-free plasmas A and B showed effective photoresist removal that was comparable to removal rates obtained with the nitrogen-containing plasmas C and D. All of the plasmas demonstrated an increase in photoresist removal rate as the hydrogen content was increased from about 5 to about 40%. At amounts greater than 40%, the increase in hydrogen content demonstrated little effect on the photoresist removal rates and the removal rate was relatively constant. It is interesting to note that the use of fluorine showed little or no difference in reactivity for the nitrogen containing plasma D whereas the use of fluorine in the nitrogen-free plasma B gave the highest removal rates. At about 20 percent hydrogen content, the removal rate for plasma B was about double the removal rate for any of the other plasmas A, C and D. Plasmas that provide the highest possible removal rate are especially advantageous for improved throughputs in production. Moreover, it is preferred to use the least amount of hydrogen in the plasma for safety considerations. Thus, having a high removal rate coupled with a low percentage of hydrogen provides a significant commercial advantage in production.

EXAMPLE 4

In this example, the effect of nitrogen and oxygen impurity levels in an oxygen and nitrogen free plasma ashing process was examined. In particular, substrates containing a porous low k carbon containing dielectric were processed at various process temperatures and various impurity levels. Thickness loss of the low k dielectric layer was measured subsequent to a 30 second rinse in 100:1 dilute HF mixture.

Figure 5:
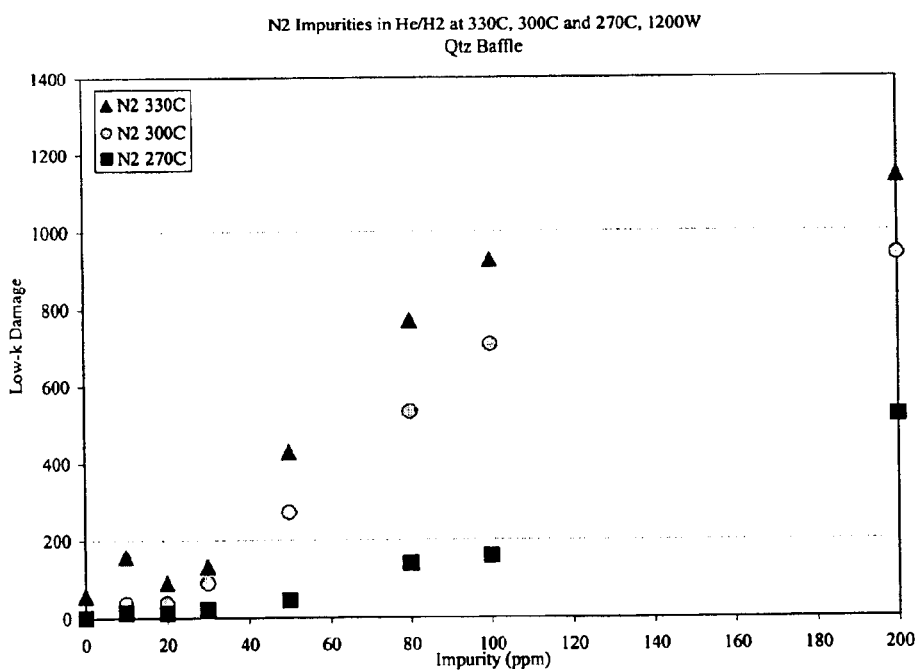
FIG. 5 graphically illustrates porous low k dielectric material damage as a function of various nitrogen impurity levels in a hydrogen/helium plasma processed at three different ashing temperatures.

FIG. 5 graphically illustrates the loss of low k dielectric for a hydrogen/helium plasma containing various nitrogen levels (parts per million) at ashing temperatures of 270, 300, and 330° C. Surprisingly, low k dielectric loss was less than 50 angstroms at a $N_2$ impurity level of about 50 ppm and an ashing process temperature of 270° C. Similar results were obtained with oxygen at an impurity level of 20 ppm. Previous experiments as demonstrated in Example 3 above suggested that damage would occur to the low k dielectric material in the presence of substantial amounts of nitrogen. The results indicate that trace amounts of nitrogen and oxygen can be tolerated without damaging the low k dielectric material, especially at lower temperatures. Moreover, since the low k dielectric material tested was porous, it is expected that denser dielectric materials (i.e., non-porous) will be less susceptible to damage and consequently, have a higher threshold for oxygen and nitrogen impurities.

EXAMPLE 5

In this example, controlled amounts of oxygen and nitrogen were separately added to a plasma formed from hydrogen and helium gases. Ash rate and hydrogen radical concentration were monitored for various levels of each gas.

Figure 6:
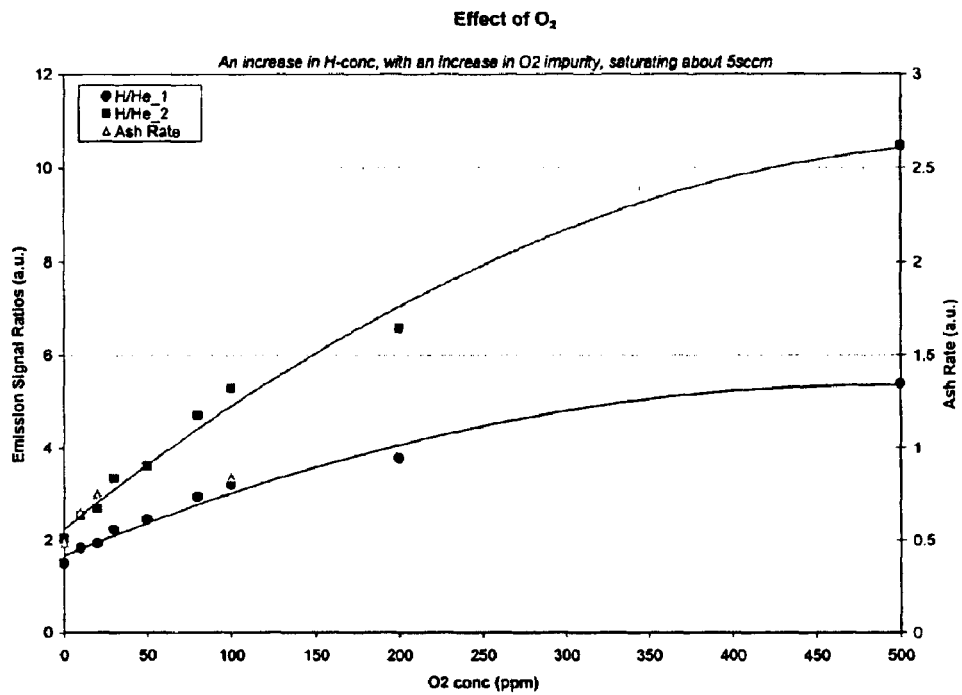
FIG. 6 graphically illustrates ashing rate and H-radical concentration as a function of oxygen impurity levels for a hydrogen/helium plasma.

FIG. 6 graphically illustrates the results for the addition of oxygen to the hydrogen and helium plasma. As shown, ash rate is significantly improved by including relatively small amounts of oxygen, which surprisingly does not damage the low k dielectric surface beyond an acceptable loss of about 50 angstroms. While not wanting to be bound by theory, it is believed that the increase in ash rate is due to increased dissociation of hydrogen molecules in the plasma, leading to an increase in the concentration of H radicals that are responsible for ashing photoresist in the hydrogen/helium ($HeH_2$) plasma. The increase in H concentration is indicated in FIG. 6 by plotting the ratio of two independently chosen emission lines of hydrogen and helium.

Figure 7:
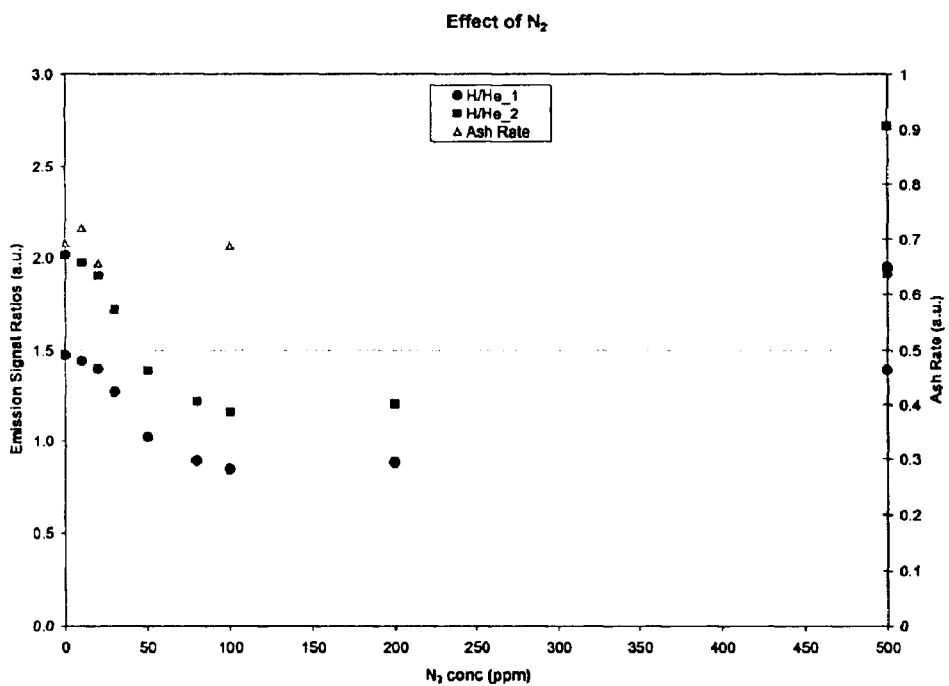
FIG. 7 graphically illustrates ashing rate and H-radical concentration as a function of nitrogen impurity levels for a hydrogen/helium plasma.

In contrast, as shown in FIG. 7, the addition of nitrogen to the $HeH_2$ plasma reduced the optical signal ratios of the two independently chosen lines of hydrogen and helium, and did not appear to impact ash rate. These results suggest that there is a reduction in the concentration of H-radicals. Although nitrogen does not appear to increase ash rate to any significant degree, it has been found that the presence of nitrogen and/or oxygen in the $HeH_2$ plasma does "soften" up polymers left over from a previous etch step that the wafers were subject to, and renders them removable in a subsequent dHF rinse step.

Figure 8A:
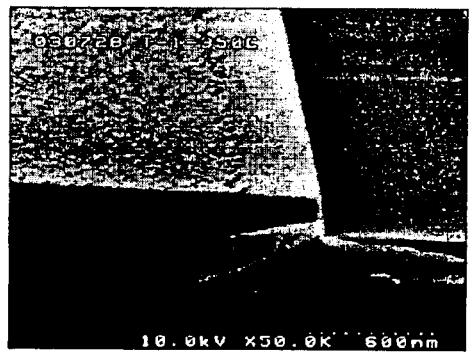
FIGS. 8(a–d) are scanning electron images of a porous low k dielectric material after exposure to a hydrogen helium plasma and after exposure to a subsequent dilute HF wet treatment.
Figure 8B:
Figure 8C:
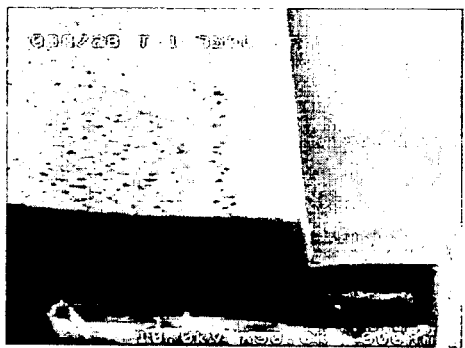
Figure 8D:

FIGS. 8a–d are scanning electron microscopy images of a patterned low-k structure after the $HeH_2$ plasma clean (8a and 8c) and after the $HeH_2$ plasma clean followed by a 30 second dilute HF clean (8b and 8d). In FIGS. 8a and 8c, the $HeH_2$ plasma is free from oxygen and nitrogen impurities. In FIGS. 8b and 8d, the $HeH_2$ plasma included nitrogen and oxygen impurities in the plasma. Clearly, it can be seen that during the subsequent dilute HF wet treatment process on the wafers exposed to the "impure" He—$H_2$ plasma readily removed the residues formed by the ashing process whereas the "pure" He—$H_2$ plasma processed wafers did not. It is noted that FIGS. 8b and 8d are at a higher magnification than FIGS. 8a and 8c, which, even at the higher magnification, does not show polymer residue remaining on the low k dielectric surface to any measurable degree.

EXAMPLE 6

Figure 9:
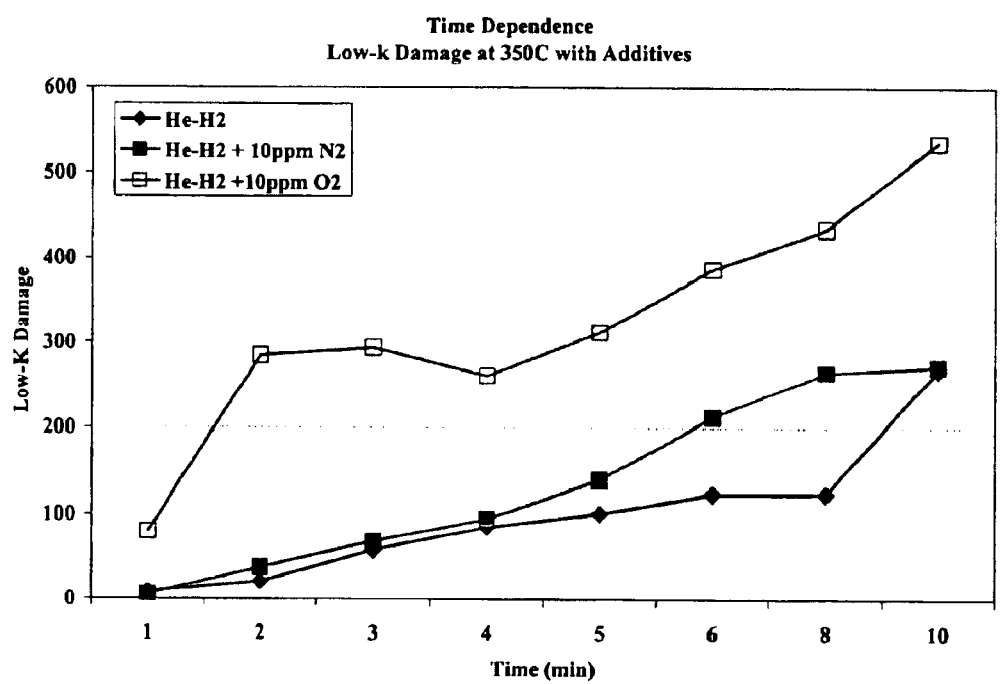
FIG. 9 graphically illustrates low k damage as a function of time for a hydrogen/helium ashing plasma with and without 10 parts per million of nitrogen and 10 parts per million of oxygen.

In this example, the loss of porous low k dielectric material as a function of plasma process time for a hydrogen/ helium ashing plasma process with and without 10 parts per million of nitrogen and 10 parts per million of oxygen was examined. As previously discussed, exact quantities of these trace gases are difficult to quantify due to the complexity of the various process parameters effecting damage to the low k dielectric material. Relating to process time, the longer a low k dielectric material is exposed to the plasma, the greater the carbon depletion, which subsequently results in a greater the loss of material after a wet treatment such as a dilute HF rinse. The ashing temperature in this example was relatively high at 350° C., which was intended to exacerbate any low k dielectric material losses. As shown in FIG. 9, the results show that there is a general increase in low k material loss as the material is exposed to the plasma for longer periods of time. While 10 ppm of nitrogen marginally affects the low k material loss, the same level for oxygen is observed as significantly affecting the loss of low k dielectric material.

In summary, the amount of oxygen and/or nitrogen in the substantially oxygen and nitrogen free process is complex and relies on numerous factors set forth above. The amounts of nitrogen and/or oxygen containing gases included in a substantially oxygen and nitrogen free plasma is an amount effective for providing a high ashing selectivity (preferably greater than 50:1) and meet desired removal rate of organic layers or throughput requirements, at the desired ashing temperature and time. In a preferred embodiment, the amounts are effective for minimizing the loss of low k dielectric material to less than about 50 angstroms. Preferably, the amount of oxygen and nitrogen traces in the substantially oxygen and nitrogen free plasma is also effective for rendering polymeric residues rinse-removable.

The foregoing descriptions of the preferred embodiments of the disclosure have been presented for purposes of illustration and description. It is not intended to be exhaustive or to limit the disclosure to the precise forms disclosed. Obvious modifications or variations are possible in light of the above teachings. The embodiments were chosen and described to provide the best illustration of the principles of the disclosure and its practical applications to thereby enable one of ordinary skill in the art to utilize the disclosure in various embodiments and with various modifications as are suited to the particular use contemplated. All such modifications and variations are within the scope of the disclosure as determined by the appended claims when interpreted in accordance with the breadth to which they are fairly, legally and equitably entitled.

What is claimed is:

1. A plasma ashing process for selectively removing photoresist and/or organic overlayers from a semiconductor substrate including a low k material, the process comprising:
    forming reactive species by exposing a plasma gas composition to an energy source to form a plasma, wherein the plasma is substantially free from reactive nitrogen species and reactive oxygen species; and
    exposing the substrate having the photoresist and/or the organic overlayers thereon to the reactive species to selectively remove the photoresist and/or the organic overlayers and leave the low k material substantially the same as before exposing the substrate to the reactive species.

2. The plasma ashing process according to claim 1, wherein the plasma gas composition consists essentially of hydrogen-bearing gas and a noble gas.

3. The plasma ashing process according to claim 2, wherein the noble gas is helium.

4. The plasma ashing process according to claim 2, wherein the hydrogen-bearing gas is selected from the group consisting of hydrocarbons, hydrofluorocarbons, and hydrogen gas.

5. The plasma ashing process according to claim 2, wherein the hydrogen bearing gas is hydrogen gas.

6. The plasma ashing process according to claim 1, wherein the low k material comprises a carbon containing material having a dielectric constant less than 3.0.

7. The plasma ashing process according to claim 1, wherein the low k material essentially does not change during the plasma ashing process.

8. The plasma ashing process according to claim 1, wherein the plasma that is substantially free from reactive nitrogen species and reactive oxygen species in an amount that removes less than about 50 angstroms of the low k dielectric material after the plasma ashing process and a subsequent wet treatment process, wherein the wet treatment process comprises wetting the substrate with a solution comprising a 100:1 hydrofluoric acid to deionized water solution for a period of 30 seconds.

9. The plasma ashing process according to claim 1, further comprising exposing the substrate to a wet treatment process, wherein a critical dimension of a feature in the substrate essentially does not change during the wet treatment process.

10. A plasma ashing process for selectively removing photoresist and/or organic overlayers from a semiconductor substrate including a low k material, the process comprising:
    forming reactive species by exposing a plasma gas composition to an energy source to form a plasma, wherein the plasma is substantially free from reactive nitrogen species and reactive oxygen species;
    introducing oxygen into the plasma in an amount effective to increase the ashing rate relative to not introducing oxygen into plasma; and
    exposing the substrate having the photoresist and/or organic overlayers thereon to the reactive species to selectively remove the photoresist and/or organic overlayers, wherein loss of the low k dielectric material is less than 50 angstroms after further exposure to a dilute hydrofluoric acid wet treatment process comprising wetting the substrate with a 100:1 hydrofluoric acid to deionized water solution for a period of 30 seconds.

11. A post etch plasma ashing process for selectively removing photoresist, organic overlayers, and polymers/residues from a semiconductor substrate, wherein the substrate includes a layer comprising a carbon containing low k dielectric material having a dielectric constant less than 3.0, the plasma ashing process comprising:
    placing the substrate including photoresist, and/or organic overlayers and/or polymers/residues on the surface of the substrate into a reaction chamber;
    forming reactive species by generating a plasma from a substantially nitrogen and oxygen free gas composition;
    exposing the substrate to the reactive species formed in the plasma from the substantially nitrogen and oxygen free gas composition; and
    selectively removing the photoresist, organic overlayers, and polymers/residues from the surface by forming volatile compounds, rinse removable compounds and mixtures thereof, wherein the trace levels of oxygen and/or nitrogen introduced into the plasma are in an amount that removes less than about 50 angstroms of the low k dielectric material after further exposure to a wet treatment process.

12. The post etch plasma ashing process according to claim 11, wherein the gas composition comprises hydrogen gas and helium gas.

13. The post etch plasma ashing process according to claim 11, wherein the gas composition further comprises a fluorine bearing gas.

14. The post etch plasma ashing process according to claim 12, wherein the hydrogen gas is in an amount ranging from about 1 percent to about 99 percent of the total gas composition.

15. The post etch plasma ashing process according to claim 12, wherein the hydrogen gas is in an amount ranging from about 3 percent to about 30 percent of the total gas composition.

16. The post etch plasma ashing process according to claim 12, wherein the hydrogen gas is in an amount ranging from about 1 percent to about 5 percent of the total gas composition.

17. The post etch plasma ashing process according to claim 12, wherein the plasma ashing process produces an ashing selectivity between the photoresist and the substrate of greater than 50:1.

18. The post etch plasma ashing process according to claim 11, wherein the dielectric constant essentially does not change during the plasma ashing process.

19. The post etch plasma ashing process according to claim 11, wherein the chemical composition of the low k dielectric material essentially does not change during the plasma ashing process.

20. The post etch plasma ashing process according to claim 11, wherein a critical dimension of a feature on the substrate essentially does not change during the wet treatment process.

21. The post etch plasma ashing process according to claim 11, wherein the wet treatment process comprises immersing the substrate in a wet chemical bath.

22. The post etch plasma ashing process according to claim 21, wherein the wet chemical bath selectively removes a carbon depleted portion of the carbon containing low k dielectric material.

23. The post etch plasma ashing process according to claim 21, wherein the wet chemical bath comprises an aqueous hydrofluoric acid solution.

24. A method of manufacturing a microelectronic device, the method comprising:
    forming a photoresist mask on a surface of a semiconductor substrate, wherein the substrate includes a carbon containing low k dielectric layer;
    etching and removing portions of the substrate through openings in the photoresist mask to permanently transfer an image into the substrate and expose a surface of the low k dielectric layer, wherein the etching forms polymers/residues on the substrate; and
    selectively ashing the photoresist mask, and removing or rendering removable the polymers/residues from the substrate with a substantially oxygen and nitrogen free plasma generated from a gas mixture comprising hydrogen and helium.

25. The method according to claim 24, wherein the low k dielectric layer has a dielectric constant less than 3.0.

26. The method according to claim 24, wherein the low k dielectric layer comprises a polymer having a backbone containing silicon.

27. The method according to claim 24, wherein the low k dielectric layer comprises a carbon doped oxide.

28. The method according to claim 24, further comprising a wet treatment of the substrate subsequent to ashing the photoresist from the substrate, wherein a critical dimension of the image in the substrate essentially does not change during the wet treatment.

29. The method according to claim 24, further comprising a wet treatment of the substrate subsequent to ashing the photoresist from the substrate, wherein the polymers/residues are substantially removed during the wet treatment.

30. The method according to claim 28, wherein the wet treatment of the substrate comprises immersing the substrate in a wet chemical bath.

31. The method according to claim 30, wherein the chemical bath comprises a chemical that removes only the carbon depleted portion of the low k dielectric material.

32. The method according to claim 31, wherein the chemical comprises an aqueous hydrofluoric acid solution at a concentration of hydrofluoric acid to water of about 100:1 to about 5000:1.

33. A plasma ashing process for selectively stripping photoresist and/or organic overlayers and/or polymers/residues from a surface of a substrate, the method comprising:
    placing a substrate having the photoresist and/or organic overlayers and/or polymers/residues thereon into a reaction chamber;
    generating a substantially oxygen and nitrogen free plasma from a gas mixture comprising hydrogen and helium, wherein the gas mixture comprises levels of oxygen and/or nitrogen containing gas in an amount that removes less than about 50 angstroms of a low k dielectric material after ashing the photoresist and/or organic overlayers and/or polymers/residues and a subsequent wet treatment process, and wherein the plasma contains both electrically neutral and charged particles;
    substantially removing the charged particles from the plasma;
    exposing the substrate and the photoresist and/or organic overlayers and/or polymers/residues to the electrically neutral species in the plasma, wherein the substrate exposed to the plasma includes a carbon containing low k dielectric material; and
    ashing the photoresist and/or organic overlayers and/or polymers/residues to selectively remove the photoresist and/or organic overlayers and/or polymers/residues from the substrate, wherein the chemical composition of the low k dielectric material is substantially the same as before the step of exposing the substrate to the plasma.

34. A plasma ashing process for selectively removing photoresist and/or organic overlayers from a semiconductor substrate including a low k material, the process comprising:
    forming reactive species by exposing a plasma gas composition to an energy source to form a plasma, wherein the plasma is substantially free from reactive nitrogen species and reactive oxygen species;
    introducing oxygen gas or an oxygen containing compound into the plasma in an amount effective to increase the ashing rate relative to not introducing oxygen into plasma;
    exposing the substrate having the photoresist and/or organic overlayers thereon to the reactive species to selectively remove the photoresist and/or organic overlayers, wherein loss of the low k material is less than 50 angstroms after further exposure to a wet treatment process comprising wetting the substrate with a solution comprising 100:1 hydrofluoric acid to deionized water solution for a period of 30 seconds.

35. A plasma ashing process for selectively stripping photoresist, organic overlayers, and/or polymers/residues from a surface of a substrate including a low k material, the method comprising:

placing the substrate having the photoresist, organic overlayers, and/or polymers/residues thereon into a reaction chamber;

exposing the substrate at a first temperature to a plasma substantially free from oxygen and nitrogen species;

adding trace amounts of oxygen and/or nitrogen to the plasma for a first period of time; and increasing the first temperature to a second temperature and stopping the addition of the trace amounts of oxygen and/or nitrogen to the plasma, and exposing the substrate for a second period of time, wherein a total amount of oxygen and/or nitrogen in the plasma and a total amount of the time is effective to remove less than about 50 angstroms of the low k material after further exposure to a wet treatment process comprising wetting the substrate with a solution comprising a 100:1 hydrofluoric acid to deionized water solution for a period of 30 seconds.

36. The plasma ashing process of claim 35, wherein the substantially oxygen and nitrogen free plasma is formed from a gas mixture comprising hydrogen and helium.

37. The plasma ashing process of claim 35, wherein the first temperature is about 100° C. to about 300° C. and the second temperature is about 250° C. to about 350° C.

38. A plasma ashing process for selectively stripping photoresist, organic overlayer, and/or polymers and residues from a surface of substrate including a low k material, the method comprising:

placing the substrate having the photoresist, organic overlayer, and/or polymers and residues thereon into a reaction chamber;

exposing the substrate at a first temperature to a plasma substantially free from oxygen and nitrogen species;

adding trace amounts of oxygen and/or nitrogen to the plasma for a period of time; and decreasing the first temperature to a second temperature and adding trace amounts of oxygen and/or nitrogen to the plasma for a period of time, and exposing the substrate for a second period of time, wherein a total amount of oxygen and/or nitrogen in the plasma and a total amount of the time is effective to remove less than about 50 angstroms of the low k material after further exposure to a wet treatment process comprising wetting the substrate with a solution comprising a 100:1 hydrofluoric acid to deionized water solution for a period of 30 seconds.

39. The plasma ashing process of claim 38, wherein the substantially oxygen and nitrogen free plasma is formed from a gas mixture comprising hydrogen and helium.

40. The plasma ashing process of claim 38, wherein the first temperature is about 250° C. to about 350° C. and the second temperature is about 100° C. to about 300° C.

* * * * *